US012777863B2

(12) United States Patent
Suzuki et al.

(10) Patent No.: US 12,777,863 B2
(45) Date of Patent: Oct. 27, 2026

(54) ETCHING METHOD AND PLASMA PROCESSING APPARATUS

(71) Applicant: Tokyo Electron Limited, Tokyo (JP)

(72) Inventors: Shoi Suzuki, Miyagi (JP); Taku Gohira, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 226 days.

(21) Appl. No.: 18/410,031

(22) Filed: Jan. 11, 2024

(65) Prior Publication Data

US 2024/0234163 A1 Jul. 11, 2024

(30) Foreign Application Priority Data

Jan. 11, 2023 (JP) ................................ 2023-002155
Dec. 25, 2023 (JP) ................................ 2023-217931

(51) Int. Cl.
*H10P 50/00* (2026.01)
*H01J 37/32* (2006.01)
*H10P 50/28* (2026.01)
*H10P 76/40* (2026.01)

(52) U.S. Cl.
CPC ........ *H10P 50/73* (2026.01); *H01J 37/32449* (2013.01); *H10P 50/283* (2026.01); *H10P 76/405* (2026.01); *H10P 76/4085* (2026.01); *H01J 37/32724* (2013.01); *H01J 2237/3346* (2013.01)

(58) Field of Classification Search
None
See application file for complete search history.

(56) References Cited

U.S. PATENT DOCUMENTS 9,673,058 B1 * 6/2017 Briggs .................. H10P 50/283

FOREIGN PATENT DOCUMENTS

JP 2016-157793 A 9/2016

* cited by examiner

*Primary Examiner* — Jiong-Ping Lu
(74) *Attorney, Agent, or Firm* — XSENSUS LLP

(57) ABSTRACT

An etching method includes providing a substrate including a first region and a second region below the first region, the first region containing a first material and having an opening, and the second region containing a second material different from the first material, and etching the second region through the opening while forming a carbon-containing layer and a metal-containing layer below the carbon-containing layer on a sidewall of the opening, by supplying, onto the substrate, plasma generated from a processing gas containing a carbon-containing gas, a metal halide gas, and a halogen scavenging gas that scavenges halogen.

15 Claims, 7 Drawing Sheets

ETCHING METHOD AND PLASMA PROCESSING APPARATUS

CROSS-REFERENCE TO RELATED APPLICATIONS

This application is based on and claims priority from Japanese Patent Application Nos. 2023-002155 and 2023-217931, filed on Jan. 11, 2023, and Dec. 25, 2023, respectively, with the Japan Patent Office, the disclosures of each are incorporated herein in their entireties by reference.

TECHNICAL FIELD

An exemplary embodiment of the present disclosure relates to an etching method and a plasma processing apparatus.

BACKGROUND

Japanese Patent Laid-Open Publication No. 2016-157793 discloses an etching method of selectively etching a first region of a substrate with respect to a second region of the substrate using plasma formed from a processing gas. The first region is formed of silicon oxide, and the second region is formed of silicon nitride. The processing gas contains fluorocarbon.

SUMMARY

In one exemplary embodiment, an etching method is provided. The etching method includes providing a substrate including a first region and a second region below the first region, the first region containing a first material and having an opening, and the second region containing a second material different from the first material and etching the second region through the opening while forming a carbon-containing layer and a metal-containing layer below the carbon-containing layer on a sidewall of the opening, by supplying, onto the substrate, plasma generated from a processing gas containing a carbon-containing gas, a metal halide gas, and a halogen scavenging gas that scavenges halogen.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
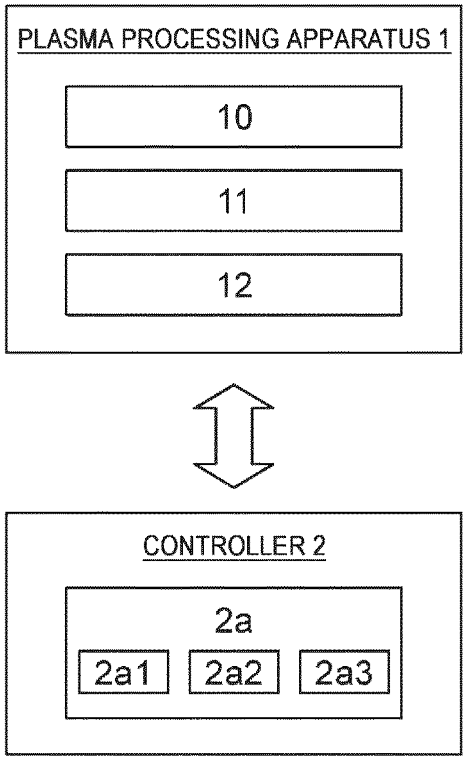
FIG. 1 is a view illustrating a configuration example of a plasma processing apparatus.

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, each exemplary embodiment of the present disclosure will be described.

In one exemplary embodiment, an etching method is provided. The etching method includes providing a substrate including a first region and a second region below the first region, the first region containing a first material and having an opening, and the second region containing a second material different from the first material, and etching the second region through the opening while forming a carbon-containing layer and a metal-containing layer below the carbon-containing layer on a sidewall of the opening, by supplying, onto the substrate, plasma generated from a processing gas containing a carbon-containing gas, a metal halide gas, and a halogen scavenging gas that scavenges halogen.

Hereinafter, each exemplary embodiment of the present disclosure will be described in detail with reference to drawings. In the drawings, the same or similar elements are denoted by the same reference numerals.

FIG. 1 is a view illustrating a configuration example of a plasma processing apparatus. In one exemplary embodiment, a plasma processing system includes a plasma processing apparatus 1 and a controller 2. The plasma processing system is an example of a substrate processing system, and the plasma processing apparatus 1 is an example of a substrate processing apparatus. The plasma processing apparatus 1 includes a plasma processing chamber 10, a substrate support 11 and a plasma generator 12. The plasma processing chamber 10 has a plasma processing space. The plasma processing chamber 10 has at least one gas supply port for supplying at least one processing gas to the plasma processing space, and at least one gas outlet for discharging gas from the plasma processing space. The gas supply port is connected to a gas supply 20 to be described below, and the gas outlet is connected to an exhaust system 40 to be described below. The substrate support 11 is disposed within the plasma processing space, and has a substrate supporting surface for supporting a substrate.

The plasma generator 12 is configured to generate plasma from at least one processing gas supplied into the plasma processing space. The plasma formed in the plasma processing space may be, for example, capacitively coupled plasma (CCP), inductively coupled plasma (ICP), electron-cyclotron-resonance plasma (ECR plasma), helicon wave-excited plasma (HWP), or surface wave plasma (SWP). Various types of plasma generators, including an alternating current (AC) plasma generator and a direct current (DC) plasma generator, may be used. In one exemplary embodiment, an AC signal (AC power) used in the AC plasma generator has a frequency within a range of 100 kHz to 10 GHz. Therefore, AC signals include radio frequency (RF)

signals and microwave signals. In one exemplary embodiment, the RF signal has a frequency within a range of 100 kHz to 150 MHz.

The controller 2 processes computer-executable instructions that cause the plasma processing apparatus 1 to execute various steps described in the present disclosure. The controller 2 may be configured to control each element of the plasma processing apparatus 1 so as to execute various steps described herein. In one exemplary embodiment, a part or all of the controller 2 may be included in the plasma processing apparatus 1. The controller 2 may include a processor 2*al*, a storage 2*a*2, and a communication interface 2*a*3. The controller 2 is realized by, for example, a computer 2*a*. The processor 2*al* may be configured to read a program from the storage 2*a*2, and to execute the read program so as to perform various control operations. This program may be stored in the storage 2*a*2 in advance, or may be acquired via a medium if necessary. The acquired program is stored in the storage 2*a*2, and is read from the storage 2*a*2 by the processor 2*al* and then is executed. The medium may be various storage media readable by the computer 2*a*, or may be a communication line connected to the communication interface 2*a*3. The processor 2*al* may be a central processing unit (CPU). The storage 2*a*2 may include a random access memory (RAM), a read only memory (ROM), a hard disk drive (HDD), a solid state drive (SSD), or a combination thereof. The communication interface 2*a*3 may communicate with the plasma processing apparatus 1 via a communication line such as a local area network (LAN).

Figure 2:
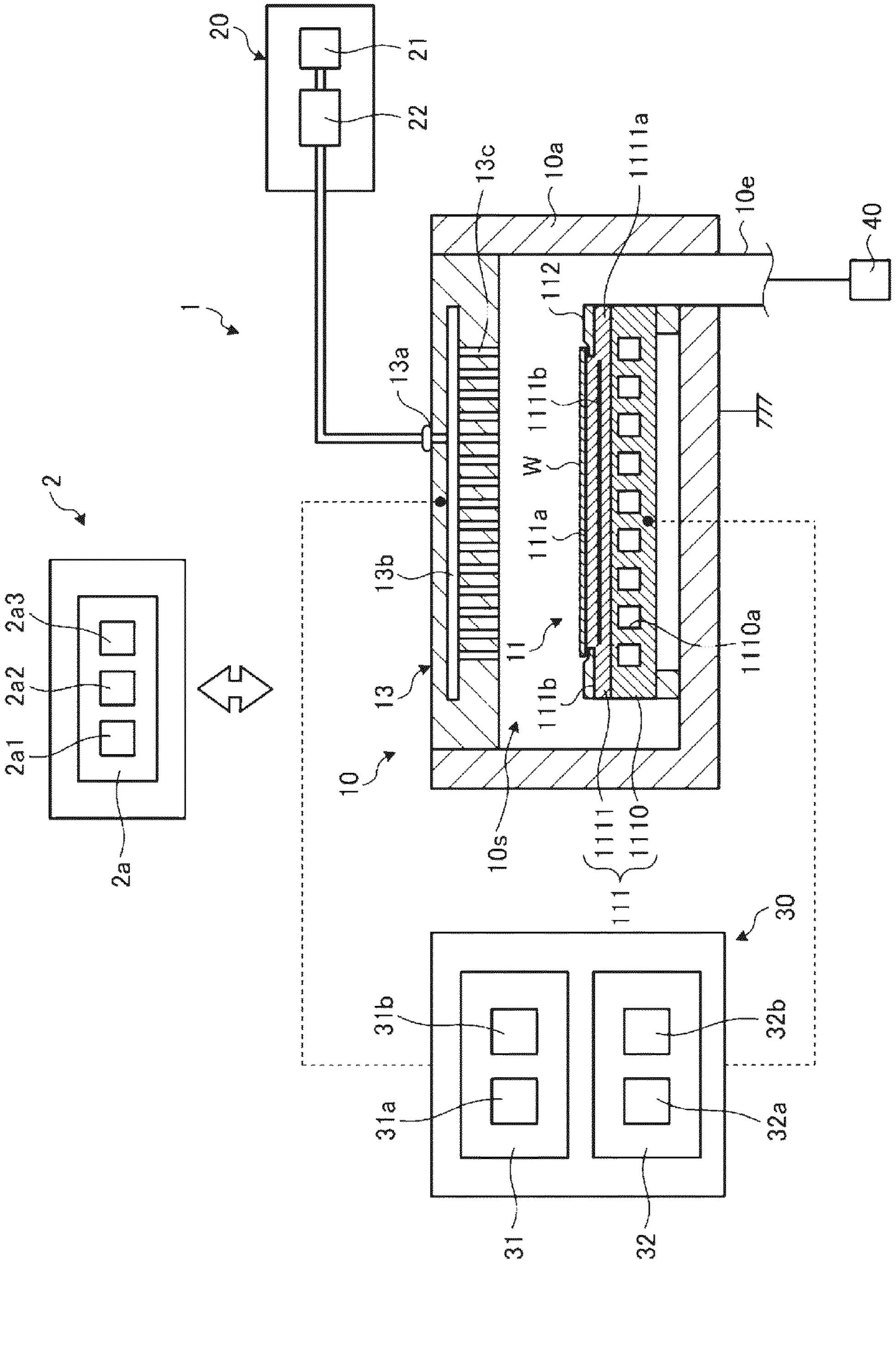
FIG. 2 is a view illustrating a configuration example of an inductively coupled plasma processing apparatus.

Hereinafter, descriptions will be made on a configuration example of an inductively coupled plasma processing apparatus as an example of the plasma processing apparatus 1. FIG. 2 is a view illustrating a configuration example of an inductively coupled plasma processing apparatus.

The inductively coupled plasma processing apparatus 1 includes the plasma processing chamber 10, the gas supply 20, a power supply 30, and the exhaust system 40. The plasma processing apparatus 1 includes the substrate support 11, and a gas introduction section. The gas introduction section is configured to introduce at least one processing gas into the plasma processing chamber 10. The gas introduction section includes a shower head 13. The substrate support 11 is disposed within the plasma processing chamber 10. The shower head 13 is disposed above the substrate support 11.

In one exemplary embodiment, the shower head 13 forms a portion of the ceiling of the plasma processing chamber 10. The plasma processing chamber 10 has a plasma processing space 10*s* defined by a sidewall 10*a* and the substrate support 11. The plasma processing chamber 10 is grounded. The shower head 13 and the substrate support 11 are electrically isolated from the housing of the plasma processing chamber 10.

The substrate support 11 includes a main body 111 and a ring assembly 112. The main body 111 has a central region 111*a* for supporting a substrate W, and an annular region 111*b* for supporting the ring assembly 112. A wafer is an example of the substrate W. In plan view, the annular region 111*b* of the main body 111 surrounds the central region 111*a* of the main body 111. The substrate W is disposed on the central region 111*a* of the main body 111, and the ring assembly 112 is disposed on the annular region 111*b* of the main body 111 so as to surround the substrate W on the central region 111*a* of the main body 111. Therefore, the central region 111*a* is also called a substrate supporting surface for supporting the substrate W, and the annular region 111*b* is also called a ring supporting surface for supporting the ring assembly 112.

In one exemplary embodiment, the main body 111 includes a base 1110 and an electrostatic chuck 1111. The base 1110 includes a conductive member. The conductive member of the base 1110 may function as a lower electrode. The electrostatic chuck 1111 is disposed on the base 1110. The electrostatic chuck 1111 includes a ceramic member 1111*a*, and an electrostatic electrode 1111*b* disposed within the ceramic member 1111*a*. The ceramic member 1111*a* has the central region 111*a*. In one exemplary embodiment, the ceramic member 1111*a* also has the annular region 111*b*. Another member surrounding the electrostatic chuck 1111, such as an annular electrostatic chuck or an annular insulating member, may have the annular region 111*b*. In this case, the ring assembly 112 may be disposed on the annular electrostatic chuck or the annular insulating member, or may be disposed on both the electrostatic chuck 1111 and the annular insulating member. At least one RF/DC electrode coupled to an RF power supply 31 and/or a DC power supply 32 to be described below may be disposed within the ceramic member 1111*a*. In this case, at least one RF/DC electrode functions as the lower electrode. When a bias RF signal and/or a DC signal to be described below is supplied to at least one RF/DC electrode, the RF/DC electrode is also called a bias electrode. The conductive member of the base 1110 and at least one RF/DC electrode may function as a plurality of lower electrodes. Also, the electrostatic electrode 1111*b* may function as the lower electrode. Therefore, the substrate support 11 includes at least one lower electrode.

The ring assembly 112 includes one or more annular members. In one exemplary embodiment, one or more annular members include one or more edge rings and at least one cover ring. The edge ring is made of a conductive material or an insulating material, and the cover ring is made of an insulating material.

The substrate support 11 may include a temperature control module configured to control at least one of the electrostatic chuck 1111, the ring assembly 112, and the substrate, to a target temperature. The temperature control module may include a heater, a heat transfer medium, and a flow path 1110*a*, or a combination thereof. A heat transfer fluid such as brine or gas flows through the flow path 1110*a*. In one exemplary embodiment, the flow path 1110*a* is formed within the base 1110, and one or more heaters are disposed within the ceramic member 1111*a* of the electrostatic chuck 1111. The substrate support 11 may include a heat transfer gas supply configured to supply a heat transfer gas to the gap between the back surface of the substrate W and the central region 111*a*. As an example, the target temperature is −80° C. or higher and 50° C. or lower.

The shower head 13 is configured to introduce at least one processing gas from the gas supply 20 into the plasma processing space 10*s*. The shower head 13 has at least one gas supply port 13*a*, at least one gas diffusion chamber 13*b*, and a plurality of gas introduction ports 13*c*. The processing gas supplied to the gas supply port 13*a* is introduced into the plasma processing space 10*s* from the plurality of gas introduction ports 13*c* by passing through the gas diffusion chamber 13*b*. Additionally, the shower head 13 includes at least one upper electrode. In addition to the shower head 13, the gas introduction section may include one or more side gas injectors (SGIs) attached to one or more openings formed in the sidewall 10*a*.

The gas supply 20 is a member that supplies the processing gas into the plasma processing chamber 10, and may include at least one gas source 21 and at least one flow controller 22. In one exemplary embodiment, the gas supply 20 is configured to supply at least one processing gas to the shower head 13, from each corresponding gas source 21 through each corresponding flow controller 22. Each flow controller 22 may include, for example, a mass flow controller or a pressure control-type flow controller. Further, the gas supply 20 may include at least one flow modulation device that modulates the flow rate of at least one processing gas or makes a pulse of the flow rate.

Accordingly, plasma is formed from at least one processing gas supplied to the plasma processing space 10*s*. The power supply 30 includes the RF power supply 31 coupled to the plasma processing chamber 10 via at least one impedance matching circuit. The RF power supply 31 is configured to supply at least one RF signal (RF power) to at least one lower electrode and/or at least one upper electrode. Therefore, the RF power supply 31 may function as at least a part of the plasma generator 12. When a bias RF signal is supplied to at least one bias electrode, a bias potential is generated in the substrate W, and ions in the formed plasma can be drawn into the substrate W.

In one exemplary embodiment, the RF power supply 31 includes a first RF generator 31*a* and a second RF generator 31*b*. The first RF generator 31*a* is coupled to at least one lower electrode and/or at least one upper electrode via at least one impedance matching circuit, and is configured to generate a source RF signal (source RF power) for plasma generation. In one exemplary embodiment, the source RF signal has a frequency within a range of 10 MHz to 150 MHz. In one exemplary embodiment, the first RF generator 31*a* may be configured to generate source RF signals having different frequencies. One or more generated source RF signals are supplied to at least one lower electrode and/or at least one upper electrode.

The second RF generator 31*b* is coupled to at least one lower electrode via at least one impedance matching circuit, and is configured to generate a bias RF signal (bias RF power). The frequency of the bias RF signal may be the same as or different from the frequency of the source RF signal. In one exemplary embodiment, the bias RF signal has a frequency lower than the frequency of the source RF signal. In one exemplary embodiment, the bias RF signal has a frequency within a range of 100 kHz to 60 MHz. In one exemplary embodiment, the second RF generator 31*b* may be configured to generate bias RF signals having different frequencies. One or more generated bias RF signals are supplied to at least one lower electrode. In various exemplary embodiments, at least one of the source RF signal and the bias RF signal may be pulsed.

The power supply 30 may include the DC power supply 32 coupled to the plasma processing chamber 10. The DC power supply 32 includes a first DC generator 32*a* and a second DC generator 32*b*. In one exemplary embodiment, the first DC generator 32*a* is connected to at least one lower electrode, and is configured to generate a first DC signal. The generated first DC signal is applied to at least one lower electrode. In one exemplary embodiment, the second DC generator 32*b* is connected to at least one upper electrode, and is configured to generate a second DC signal. The generated second DC signal is applied to at least one upper electrode.

In various exemplary embodiments, the first and second DC signals may be pulsed. In this case, a sequence of voltage pulses is applied to at least one lower electrode and/or at least one upper electrode. The voltage pulses may have a pulse waveform of a rectangle, a trapezoid, a triangle or a combination thereof. In one exemplary embodiment, a waveform generator for generating a sequence of voltage pulses from DC signals is connected between the first DC generator 32*a* and at least one lower electrode. Therefore, the first DC generator 32*a* and the waveform generator constitute a voltage pulse generator. When the second DC generator 32*b* and the waveform generator constitute a voltage pulse generator, the voltage pulse generator is connected to at least one upper electrode. The voltage pulse may have a positive polarity or may have a negative polarity. The sequence of voltage pulses may include one or more positive voltage pulses and one or more negative voltage pulses within one period. The first and second DC generators 32*a* and 32*b* may be provided in addition to the RF power supply 31, or the first DC generator 32*a* may be provided instead of the second RF generator 31*b*.

The exhaust system 40 may be connected to, for example, a gas outlet 10*e* provided at the bottom of the plasma processing chamber 10. The exhaust system 40 may include a pressure regulation valve and a vacuum pump. By the pressure regulation valve, the pressure within the plasma processing space 10*s* is adjusted. The vacuum pump may include a turbomolecular pump, a dry pump or a combination thereof.

Figure 3:
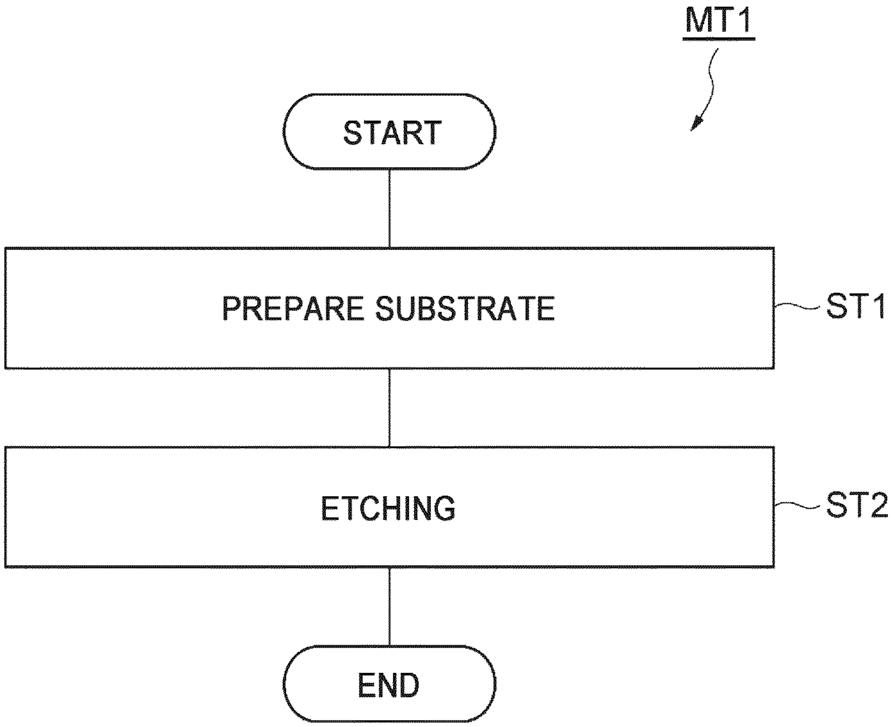
FIG. 3 is a flowchart illustrating an etching method according to one exemplary embodiment.

FIG. 3 is a flow chart illustrating an etching method according to one exemplary embodiment. An etching method MT1 (hereinafter referred to as "method MT1") illustrated in FIG. 3 may be performed by the plasma processing apparatus 1 of the above-described embodiment. The method MT1 may be applied to a substrate W.

Figure 4A:
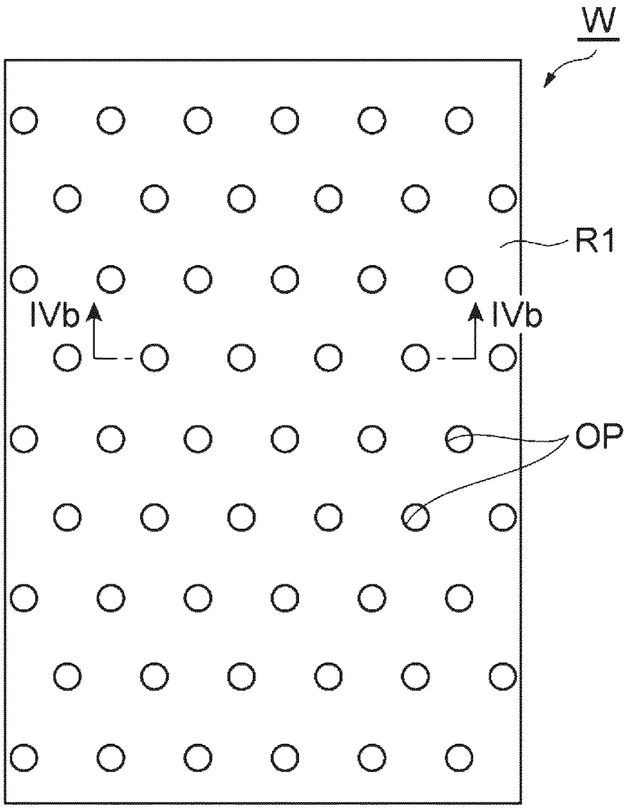
FIG. 4A is a plan view of an exemplary substrate to which the method of FIG. 3 can be applied.
Figure 4B:
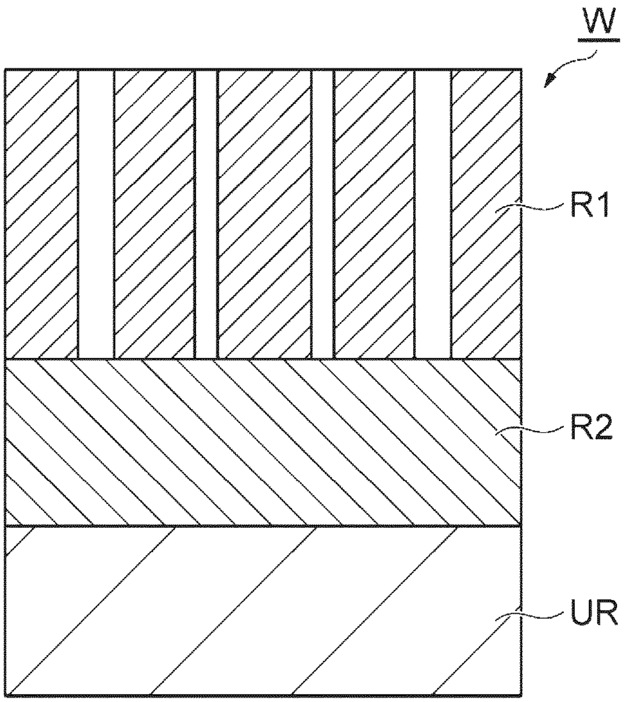
FIG. 4B is a schematic cross-sectional view taken along line IVb-IVb of FIG. 4A.

FIG. 4A is a plan view of an exemplary substrate to which the method of FIG. 3 can be applied. FIG. 4B is a schematic cross-sectional view taken along line IVb-IVb of FIG. 4A. As illustrated in FIGS. 4A and 4B, in one exemplary embodiment, the substrate W includes a first region R1 and a second region R2 positioned below the first region R1. The first region R1 may have at least one opening OP. The first region R1 may have a plurality of openings OP. The opening OP may have a hole pattern or a line pattern. The critical dimension (CD) of the opening OP may be 150 nm or less, 100 nm or less, 50 nm or less, 30 nm or less, or 20 nm or less. The substrate W may further include an underlying region UR. For example, the underlying region UR is positioned below the second region R2.

The first region R1 is a laminar region containing a first material. The first region R1 may be a mask having an opening OP on the second region R2. In one example, the first region R1 is a mask containing a non-metal element. The non-metal element may include, for example, hydrogen, nitrogen, oxygen, etc. In one example, the first region R1, which is a mask containing a non-metal element, may be a silicon nitride film or the like. In one example, the first region R1 is a mask containing a metal element. The metal element may include, for example, tungsten, molybdenum, ruthenium, tin, titanium, etc. In this case, the first region R1 may be a tungsten-containing film (e.g., a WC film, a WSi film, etc.), a molybdenum-containing film, a ruthenium-containing film, a tin-containing film (e.g., a $SnO_X$ film, etc.), a titanium-containing film (e.g., TiN film, etc.), or the like. In one example, the first region R1 is a mask containing a semimetal element. The semimetal element may include, for example, boron, carbon, silicon, etc. In one example, the first region R1 may be a photoresist film such as a photoresist film for EUV exposure. In one example, the first region R1, which is a mask containing a semimetal element, may be an organic film such as an amorphous carbon film.

The second region R2 is a laminar region containing a second material different from the first material. The second material includes, for example, a first material including silicon. The second region R2 may have a single-layer structure or a multi-layer structure. In one example, the second region R2 contains silicon oxide ($SiO_X$), silicon nitride ($SiN_X$), silicon oxynitride ($SiO_XN_Y$), etc. Each of X and Y is an integer of 1 or more.

The underlying region UR may include at least one film for a memory device such as DRAM or 3D-NAND, for example.

Figure 5:
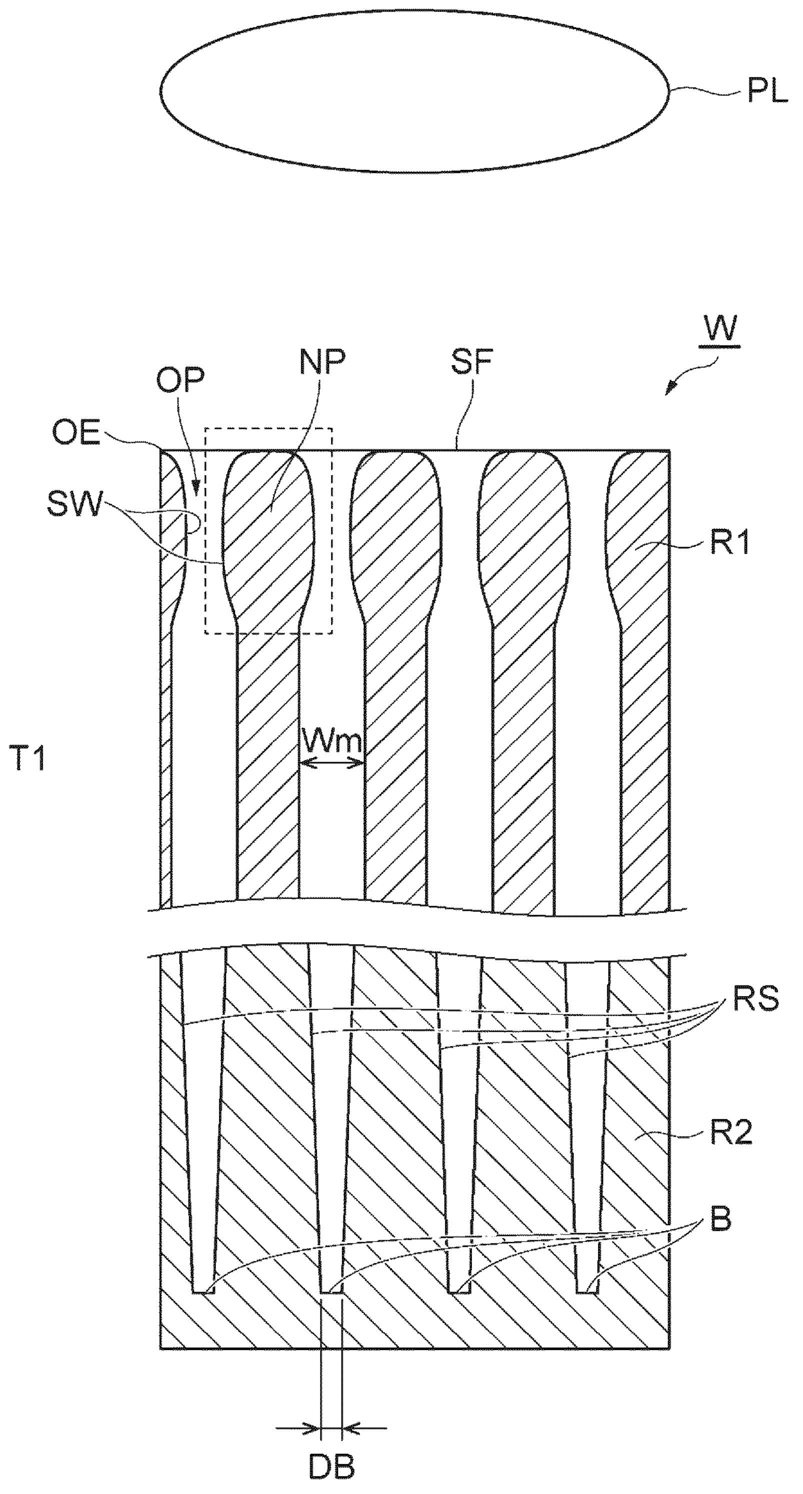
FIG. 5 is a cross-sectional view illustrating one step of an etching method according to an exemplary embodiment.
Figure 6:
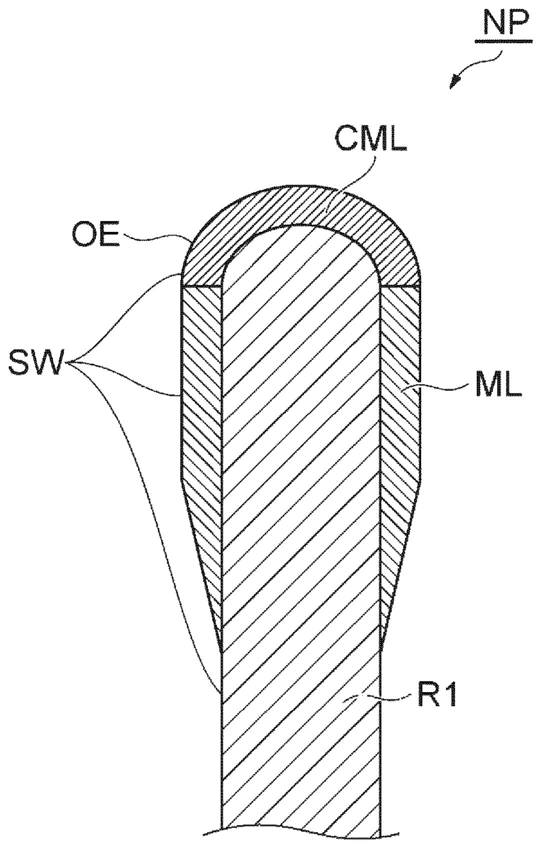
FIG. 6 is a schematic enlarged view of position indicated by broken line in FIG. 5.

Hereinafter, the method MT1 will be described with reference to FIGS. 3 to 6, taking, as an example, a case where the method MT1 is applied to the substrate W using the plasma processing apparatus 1 of the above-described embodiment. FIG. 5 is a cross-sectional view illustrating one step of an etching method according to an exemplary embodiment. FIG. 6 is a schematic enlarged view of position indicated by broken line in FIG. 5. When the plasma processing apparatus 1 is used, the method MT1 may be executed in the plasma processing apparatus 1 in such a way that the controller 2 controls each part of the plasma processing apparatus 1. In the method MT1, the substrate W on the substrate support 11 disposed within the plasma processing chamber 10 is processed, as illustrated in FIG. 2.

As illustrated in FIG. 3, the method MT1 may include step ST1 and step ST2. The step ST1 and the step ST2 may be executed sequentially.

(Step ST1)

In the step ST1, the substrate W illustrated in FIGS. 4A and 4B is prepared. The substrate W may be supported by the substrate support 11 within the plasma processing chamber 10.

(Step ST2)

In the step ST2, first, in the plasma processing chamber 10, a processing gas is supplied onto the substrate W, and plasma is then generated from the processing gas. Accordingly, as illustrated in FIGS. 5 and 6, the plasma PL generated from the processing gas is supplied onto the substrate W, and the second region R2 is etched through an opening OP. In addition, a carbon-containing layer CML and a metal-containing layer ML below the carbon-containing layer CML are formed on the sidewall SW of the opening OP. Therefore, a neck portion NP having the carbon-containing layer CML and the metal-containing layer ML is formed on and around the surface SF of the first region R1 within the opening OP. Additionally, a recess RS corresponding to the opening OP of the first region R1 may be formed in the second region R2. The critical dimension (CD) of the recess RS becomes narrower as the recess RS approaches the bottom B of the recess RS, but is not limited thereto. The critical dimension (CD) of the recess RS may be constant. The bottom B of the recess RS has a substantially planar shape. The critical dimension DB (CD) of the bottom B may be 20 nm or more or may be 30 nm or more. The critical dimension DB (CD) of the bottom B may be 40 nm or less or may be 0 nm. The fact that the critical dimension DB (CD) of the bottom B is 0 nm corresponds to the fact that the bottom B has a tapered shape. The critical dimension DB (CD) of the bottom B may be 60 nm or more and may be 85 nm or more. The recess RS may be an opening.

In the step ST2, the controller 2 of the plasma processing apparatus 1 exposes the first region R1 and the second region R2 to the plasma PL by controlling the gas supply 20 and the plasma generator 12 while the substrate W is supported on the substrate support 11. Accordingly, the carbon-containing layer CML and the metal-containing layer ML are formed on the sidewall SW of the opening OP, and the second region R2 is etched through the opening OP. Further, in the step ST2, the controller 2 adjusts a temperature of the substrate support 11 which supports the substrate W to a relatively low temperature (e.g., −80° ° C. or more and 60° C. or less) by controlling the substrate support 11. Accordingly, the temperature of the substrate W becomes closer to the temperature of the substrate support 11.

The processing gas of the step ST2 includes a carbon-containing gas, a halogenated metal gas, and a halogen scavenging gas.

The carbon-containing gas may include at least one of hydrocarbon ($C_XH_Y$) gas, fluorocarbon ($C_XF_Y$) gas, chlorocarbon ($C_XH_YCl_Z$) gas, hydrofluorocarbon ($C_XH_YF_Z$) gas, and hydrochlorofluorocarbon ($C_XH_YCl_ZF_W$) gas. In each of the hydrocarbon gas, the fluorocarbon gas, and the hydrofluorocarbon gas, each of X, Y and Z is an integer of 1 or more. In the chlorocarbon gas, each of X and Z is an integer of 1 or more, and Y is an integer of 0 or more. Additionally, in the hydrochlorofluorocarbon gas, each of X, W, and Z is an integer of 1 or more, and Y is an integer of 0 or more. Examples of the fluorocarbon gas include $CF_4$ gas, $C_3F_6$ gas, $C_3F_8$ gas, $C_4F_8$ gas, $C_4F_6$ gas, $CF_2Br_2$ gas, $C_2F_3Br$ gas, etc. Examples of the chlorocarbon gas include $CCl_4$ gas, $CH_2Cl_2$ gas, $CHCl_3$ gas, etc. Examples of the hydrofluorocarbon gas include $CH_2F_2$ gas, $CHF_3$ gas, $CH_3F$ gas, $C_4H_2F_6$ gas, etc. Examples of the hydrochlorofluorocarbon gas include $CH_2ClF$ gas, $CHCl_2F$ gas, etc.

The metal halide gas may contain at least one metal of tungsten, titanium, molybdenum, platinum, niobium, and rhenium. The metal halide gas may contain fluorine. The metal halide gas may include tungsten hexafluoride ($WF_6$) gas, tungsten hexachloride ($WCl_6$) gas, titanium tetrachloride ($TiCl_4$) gas, molybdenum hexafluoride ($MoF_6$) gas, platinum hexafluoride ($PtF_6$) gas, niobium fluoride ($NbF_5$) gas, rhenium hexafluoride ($ReF_6$) gas, and rhenium heptafluoride ($ReF_7$) gas. In other words, the metal halide contained in the metal halide gas may include at least one of tungsten hexafluoride ($WF_6$), titanium tetrachloride ($TiCl_4$), tungsten hexachloride ($WCl_6$), molybdenum hexafluoride ($MoF_6$), niobium pentafluoride ($NbF_5$), rhenium hexafluoride ($ReF_6$), rhenium hexafluoride ($ReF_7$), and platinum hexafluoride ($PtF_6$). The metal halide contained in the metal halide gas may be tungsten hexafluoride ($WF_6$) or molybdenum hexafluoride ($MoF_6$).

The halogen scavenging gas is a gas that removes unwanted halogen in the plasma processing chamber 10. The halogen is desorbed from the surface of an object to be sputtered, for example, through sputtering with the halogen scavenging gas. In one example, fluorine in the plasma processing chamber 10 may be well removed by the supply of the halogen scavenging gas. The halogen scavenging gas contains at least one of, for example, $H_2$, CO, $CO_2$, a hydrogen-containing gas excluding hydrogen fluoride, a boron-containing gas, a silicon-containing gas, a phosphorus-containing gas, and a noble gas. The hydrogen-containing gas excluding hydrogen fluoride may be, for example, hydrocarbon ($C_XH_Y$) gas, fluorocarbon ($C_XF_Y$) gas, chlorocarbon ($C_XH_YCl_Z$) gas, hydrofluorocarbon ($C_XH_YF_Z$) gas, hydrochlorofluorocarbon ($C_XH_YCl_ZF_W$) gas, ammonia ($NH_3$) gas, water vapor ($H_2O$) gas, etc. The boron-containing gas may be, for example, boron trifluoride ($BF_3$) gas, boron trichloride ($Bcl_3$) gas, boron tribromide ($Bbr_3$) gas, monoborane ($BH_3$) gas, diborane ($B_2H_6$) gas, etc. The silicon-containing gas may be, for example, silicon tetrafluoride ($SiF_4$) gas, silicon tetrachloride ($SiCl_4$) gas, monosilane ($SiH_4$) gas, disilane ($Si_2H_6$) gas, alkylsilane gas, aminosilane gas, silane chloride ($SiH_XCl_Y$) gas, etc. In the silane chloride gas, each of X and Y is an integer greater than or equal to 1. The phosphorus-containing gas may be, for example, phosphine ($PH_3$) gas, phosphorus trifluoride ($PF_3$)

gas, etc. In one example, the halogen scavenging gas contains at least a silicon-containing gas (e.g., a silicon tetrachloride gas).

In the step ST2, when supplying the processing gas, a flow rate of the metal halide gas and a flow rate of the carbon-containing gas are each less than a flow rate of the halogen scavenging gas. The flow rate of the metal halide gas may be greater than the flow rate of the carbon-containing gas, less than the flow rate of the carbon-containing gas, or equal to the flow rate of the carbon-containing gas. In one example, each of the flow rate of the metal halide gas and the flow rate of the carbon-containing gas may be 20 sccm or less, 10 sccm or less, or 3 sccm or more. The flow rate of the halogen scavenging gas may be 30 sccm or less or 20 sccm or less. In one example, the flow rate of the metal halide gas may be ½ or less, ⅓ or less, ¼ or less of the flow rate of the halogen scavenging gas. The ratio of the flow rate of the metal halide gas to the total flow rate of the carbon-containing gas, the metal halide gas, and the halogen scavenging gas may be, for example, 0.01 vol % or more, 0.1 vol % or more, or 1 vol % or more. The ratio of the flow rate of the metal halide gas to the total flow rate of the carbon-containing gas, the metal halide gas, and the halogen scavenging gas may be, for example, 30 vol % or less, 20 vol % or less, or 10 vol % or less. In one example, the flow rate of the metal halide gas is the same as the flow rate of the carbon-containing gas, satisfying the above ratio.

The carbon-containing layer CML is a laminar deposit formed during the step ST2 and is derived from the carbon-containing gas. In one example, as the carbon-containing layer CML is formed, the opening end OE of the opening OP and a portion of the sidewall SW of the opening OP are defined by the carbon-containing layer CML. In other words, after the step ST2, the opening end OE and the portion of the sidewall SW are formed with the carbon-containing layer CML. In FIG. 6, the cross-sectional shape of the carbon-containing layer CML on the neck portion NP has an approximately arc shape, but is not limited thereto. When viewed from the stacking direction of the first region R1 and the second region R2, the carbon-containing layer CML has a ring shape.

The metal-containing layer ML is a laminar deposit formed during the step ST2 and is derived from at least metal halide gas. The metal-containing layer ML may be derived from a metal halide gas and a halogen scavenging gas. In this case, the metal-containing layer ML may contain a metal element contained in the metal halide gas and an element contained in the halogen scavenging gas. The metal-containing layer ML is positioned below the carbon-containing layer CML and is also in contact with the carbon-containing layer CML. In one example, the metal-containing layer ML and the carbon-containing layer CML are formed continuously with each other. In other words, the metal-containing layer ML and the carbon-containing layer CML are formed without a gap between them. In one example, as the metal-containing layer ML is formed, another portion of the sidewall SW of the opening OP is defined by the metal-containing layer ML. When viewed from the stacking direction of the first region R1 and the second region R2, the metal-containing layer ML has a ring shape. In one example, the metal-containing layer ML may be a cylindrical metal-containing portion provided on the sidewall SW. In this case, a difference between the thickness of the top portion of the metal-containing layer ML and the thickness of the central portion of the metal-containing layer ML in the direction of the depth of the opening OP may be, for example, 20% or less, 15% or less, 10% or less. The metal-containing layer ML may contain metal oxide. The metal oxide may include at least one of tungsten oxide, titanium oxide, molybdenum oxide, niobium oxide, and rhenium oxide. When the halogen scavenging gas contains a silicon-containing gas, the metal-containing layer ML may contain a metal element and silicon. Further, a distance between the top portion and the central portion of the metal-containing layer ML is greater than 0 nm.

During the step ST2, particularly during the supply of the processing gas, the supply of the metal halide gas of the processing gas to the plasma processing chamber 10 may be limited or stopped. For example, during the supply of the processing gas, a first period in which the metal halide gas is supplied at a first flow rate and a second period in which the metal halide gas is not supplied or is supplied at a second flow rate smaller than the first flow rate may be set. Alternatively, during the step ST2, the metal halide gas may be supplied intermittently to the plasma processing chamber 10. In this case, the controller 2 may control the gas supply 20 to pause the supply of the metal halide gas or to supply the metal halide gas intermittently. Alternatively, a cycle including the first period and the second period may be repeated during the supply of the processing gas. By adjusting the supply time, the supply pause time, or the like of the metal halide gas, the shape of the metal-containing layer ML may be controlled to a desired shape. The supply pause time of the metal halide gas is at least shorter than the supply time of the metal halide gas. That is, the second period is shorter than the first period. Further, the flow rate ratio of the metal halide gas during the step ST2 may be changed continuously or may be changed stepwise. Alternatively, the flow rate of the metal halide gas during the step ST2 may be changed continuously or may be changed stepwise. For example, the flow rate ratio of the metal halide gas may be reduced continuously or may be reduced stepwise. Alternatively, the flow rate of the metal halide gas may be reduced continuously or may be reduced stepwise. Furthermore, the flow rate ratio of the metal halide gas is equivalent to the ratio of the metal halide gas to the total amount of the processing gas.

Figure 7A:
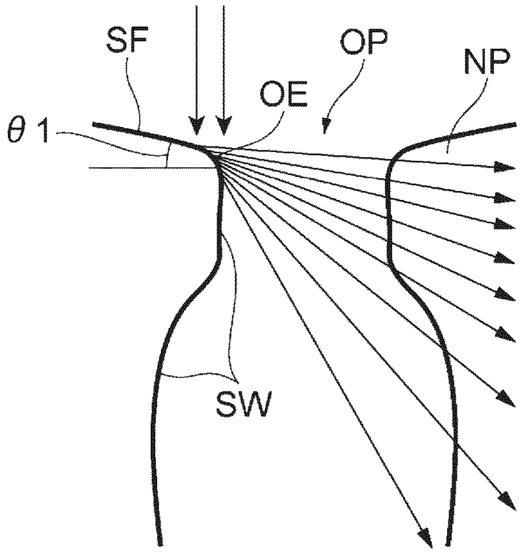
FIG. 7A is a schematic diagram illustrating recoil of etching ions in one exemplary embodiment.
Figure 7B:
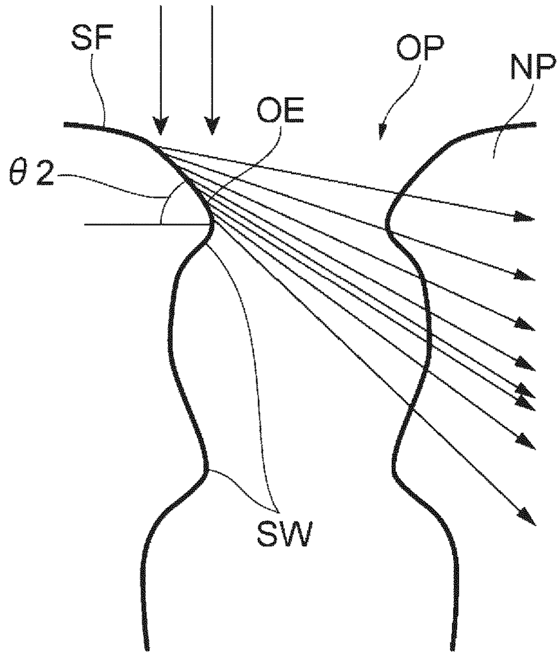
FIG. 7B is a schematic diagram illustrating recoil of etching ions in a comparison example.

According to the method MT1, the control of the shape of the opening OP of the first region R1 may be improved. More specifically, the verticality of the sidewall SW of the opening OP may be improved. This phenomenon is particularly likely to occur in etching methods performed at relatively low temperatures (e.g., not more than 50° C.). The mechanism is speculated as follows, with reference to FIGS. 7A and 7B, but is not limited thereto. FIG. 7A is a schematic diagram illustrating recoil of etching ions in one exemplary embodiment, and FIG. 7B is a schematic diagram illustrating recoil of etching ions in a comparison example.

In the step ST2, a carbon-containing layer CML is formed in such a way that a deposit primarily containing carbon (carbon-containing deposit) is attached to a mask. In this case, the processing gas used in the step ST2 contains a carbon-containing gas, a metal halide gas, and a halogen scavenging gas. Accordingly, the halogen scavenging gas removes halogen from the carbon-containing layer CML, thus increasing the density of carbon in the carbon-containing layer CML. This increases the etching resistance of the carbon-containing layer CML, making the carbon-containing layer CML more difficult to be etched. In this case, the surface SF at and around the opening end OE tends to be gently sloped, as illustrated in FIG. 7A. In other words, a slope angle θ1 of the surface SF at and around the opening end OE tends to be small. When the surface SF at and around the opening end OE is gently sloped, ions colliding with the opening end OE and the vicinity thereof are less likely to recoil in a particular direction. Accordingly, when a portion of the sidewall SW of the opening OP is a metal-containing layer ML, for example, only a portion of the metal-containing layer ML is difficult to be etched excessively. Therefore, when a portion of the sidewall SW is the metal-containing layer ML, the thickness of the metal-containing layer ML may be uniform.

In contrast, in the etching step, when the processing gas does not contain a carbon-containing gas, a carbon-containing layer is not formed. Additionally, when the processing gas does not contain a metal halide gas, a metal-containing layer is not formed. When the processing gas does not contain a halogen scavenging gas, the carbon-containing layer is easily etched. Accordingly, as illustrated in FIG. 7B, the slope angle 02 of the surface SF around the end of the opening OP increases. In this case, ions that collide with the end tend to recoil in a specific direction. Even when the ratio of fluorine to carbon (hereinafter referred to as F/C ratio) in the carbon-containing layer CML is high, the slope angle θ2 of the surface SF around the end of the opening OP tends to increase. Therefore, in cases where a portion of the sidewall SW of the opening OP is a metal-containing layer, only a portion of the metal-containing layer is likely to be excessively etched. In this case, there is a risk that a point may be formed where the critical dimension (CD) of the opening OP becomes extremely narrow, and there is a risk that the opening OP may be clogged by a deposit. Additionally, when a point is formed where the critical dimension (CD) of the opening OP becomes narrow, the critical dimension (CD) of the bottom B of the recess RS also tends to become narrow.

By performing the step ST2 according to the embodiment described above, control of the shape of the opening OP by etching may be improved. Accordingly, even when the design critical dimension (CD) of the opening OP itself is small, the critical dimension (CD) of the opening OP may be controlled to be wide. As a result, it is speculated that the critical dimension DB (CD) of the bottom B of the recess RS is expandable, but the mechanism is not limited thereto. Additionally, by performing the step ST2, the opening OP is less likely to be clogged.

In one exemplary embodiment, in the step ST2, the carbon-containing layer CML and the metal-containing layer ML are formed on the first region R1. Accordingly, the etching amount of the first region R1 is reduced. When the etching selectivity of the second region R2 with respect to the first region R1 is improved, the thickness of the first region R1 may be reduced.

In one exemplary embodiment, in the step ST2, when the carbon-containing gas is hydrofluorocarbon gas, the opening OP is less likely to be clogged.

In one exemplary embodiment, in the step ST2, when the ratio of the flow rate of the metal halide gas to the total flow rate of the carbon-containing gas, the metal halide gas, and the halogen scavenging gas is 1 vol % or more and 30 vol % or less, the shape (particularly the thickness) of the metal-containing layer ML may be controlled to be satisfactory.

Although various exemplary embodiments have been described above, the present invention is not limited to the above-described exemplary embodiments, and various additions, omissions, substitutions, and changes may be made. Additionally, it is possible to combine elements from different embodiments to form other embodiments. For example, method MT may be performed using a plasma processing device different from the plasma processing device 1.

Here, various exemplary embodiments included in the present disclosure will be described in the followings [E1] to [E19].

[E1] An etching method including providing a substrate including a first region and a second region below the first region, the first region containing a first material and having an opening, and the second region containing a second material different from the first material, and etching the second region through the opening while forming a carbon-containing layer and a metal-containing layer below the carbon-containing layer on a sidewall of the opening, by supplying, onto the substrate, plasma generated from a processing gas containing a carbon-containing gas, a metal halide gas, and a halogen scavenging gas that scavenges halogen.

[E2] The etching method described in [E1], in which the carbon-containing gas is at least one selected from the group consisting of a hydrocarbon gas, a fluorocarbon gas, a chlorocarbon gas, a hydrofluorocarbon gas, and a hydrochlorofluorocarbon gas.

[E3] The etching method described in [E2], in which the carbon-containing gas is a hydrofluorocarbon gas.

[E4] The etching method described in any one of [E1] to [E3], in which metal halide contained in the metal halide gas is at least one selected from the group consisting of $WF_6$, $TiCl_4$, $WCl_6$, $MoF_6$, $NbF_5$, $Ref_6$, $ReF_7$, and $PtF_6$.

[E5] The etching method described in any one of [E1] to [E4], in which metal halide contained in the metal halide gas is $WF_6$ or $MoF_6$.

[E6] The etching method described in any one of [E1] to [E5], in which the halogen scavenging gas is at least one selected from the group consisting of $H_2$, CO, $CO_2$, a hydrogen-containing gas excluding hydrogen fluoride, a boron-containing gas, a silicon-containing gas, a phosphorus-containing gas, and a noble gas.

[E7] The etching method described in any one of [E1] to [E6], in which the halogen scavenging gas is at least one selected from the group consisting of a hydrogen-containing gas excluding hydrogen fluoride, a boron-containing gas, a silicon-containing gas, and a phosphorus-containing gas.

[E8] The etching method described in any one of [E1] to [E7], in which the halogen scavenging gas includes a silicon-containing gas.

[E9] The etching method described in any one of [E1] to [E8], in which a ratio of a flow rate of the metal halide gas to a total flow rate of the carbon-containing gas, the metal halide gas, and the halogen scavenging gas is 0.01 vol % or more and 30 vol % or less.

[E10] The etching method described in any one of [E1] to [E9], in which a flow rate of the metal halide gas is less than ½ of a flow rate of the halogen scavenging gas.

[E11] The etching method described in any one of [E1] to [E10], in which a temperature of a substrate support supporting the substrate is −80° C. or more and 60° C. or less in the etching the second region.

[E12] The etching method described in any one of [E1] to [E11], in which the first region is a mask containing a non-metal element, a semi-metal element, or a metal element.

[E13] The etching method described in any one of [E1] to [E12], in which the carbon-containing layer and the metal-containing layer are in contact with each other and have a ring shape.

[E14] The etching method described in any one of [E1] to [E13], in which the etching the second region includes supplying the processing gas onto the substrate, and generating the plasma from the processing gas, and in which the supplying the processing gas includes a first period in which the metal halide gas is supplied at a first flow rate, and a second period in which the metal halide gas is not supplied or is supplied at a second flow rate smaller than the first flow rate.

[E15] The etching method described in [E14], in which a cycle including the first period and the second period is repeated in the supplying the processing gas.

[E16] The etching method described in [E14] or [E15], in which the second period is shorter than the first period.

[E17] The etching method described in any one of [E14] to [E16], in which a flow rate ratio of the metal halide gas is changed continuously or stepwise in the etching the second region.

[E18] The etching method described in any one of [E14] to [E17], in which a flow rate ratio of the metal halide gas is reduced continuously or stepwise in the etching the second region.

[E19] A plasma processing apparatus including:

a chamber, a substrate support provided in the chamber, a gas supply configured to supply a processing gas into the chamber, a plasma generator configured to generate plasma from the processing gas in the chamber, and a controller, in which the controller is configured to control the gas supply and the plasma generator in a state where the substrate support supports a substrate including a first region and a second region below the first region, the first region containing a first material and having an opening, and the second region containing a second material different from the first material, to perform etching the second region through the opening while forming a carbon-containing layer and a metal-containing layer below the carbon-containing layer on a side-wall of the opening, by exposing the first region and the second region to the plasma.

According to one exemplary embodiment, a technique for improving control of a shape of an opening by etching is provided.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An etching method comprising:

providing a substrate including a first region and a second region below the first region, the first region containing a first material and having an opening, and the second region containing a second material different from the first material; and etching the second region through the opening while forming a carbon-containing layer and a metal-containing layer below the carbon-containing layer on a side-wall of the opening, by supplying, onto the substrate, plasma generated from a processing gas containing a carbon-containing gas, a metal halide gas, and a halogen scavenging gas that scavenges halogen, wherein the halogen scavenging gas includes a silicon-containing gas.

2. The etching method according to claim 1, wherein the carbon-containing gas is at least one selected from the group consisting of a hydrocarbon gas, a fluorocarbon gas, a chlorocarbon gas, a hydrofluorocarbon gas, and a hydrochlorofluorocarbon gas.

3. The etching method according to claim 2, wherein the carbon-containing gas is a hydrofluorocarbon gas.

4. The etching method according to claim 1, wherein metal halide contained in the metal halide gas is at least one selected from the group consisting of WF6, TiCl4, WC16, MoF6, NbF5, Ref6, ReF7, and PtF6.

5. The etching method according to claim 1, wherein metal halide contained in the metal halide gas is WF6 or MoF6.

6. The etching method according to claim 1, wherein a ratio of a flow rate of the metal halide gas to a total flow rate of the carbon-containing gas, the metal halide gas, and the halogen scavenging gas is 0.01 vol % or more and 30 vol % or less.

7. The etching method according to claim 1, wherein a flow rate of the metal halide gas is less than ½ of a flow rate of the halogen scavenging gas.

8. The etching method according to claim 1, wherein a temperature of a substrate support supporting the substrate is −80° C. or more and 60° C. or less in the etching the second region.

9. The etching method according to claim 1, wherein the first region is a mask containing a non-metal element, a semi-metal element, or a metal element.

10. The etching method according to claim 1, wherein the carbon-containing layer and the metal-containing layer are in contact with each other and have a ring shape.

11. The etching method according to claim 1, wherein the etching the second region includes supplying the processing gas onto the substrate; and generating the plasma from the processing gas, and wherein the supplying the processing gas includes a first period in which the metal halide gas is supplied at a first flow rate, and a second period in which the metal halide gas is not supplied or is supplied at a second flow rate smaller than the first flow rate.

12. The etching method according to claim 11, wherein a cycle including the first period and the second period is repeated in the supplying the processing gas.

13. The etching method according to claim 11, wherein the second period is shorter than the first period.

14. The etching method according to claim 1, wherein a flow rate ratio of the metal halide gas is changed continuously or stepwise in the etching the second region.

15. The etching method according to claim 1, wherein a flow rate ratio of the metal halide gas is reduced continuously or stepwise in the etching the second region.

* * * * *